United States Patent
Shi et al.

(10) Patent No.: US 9,453,866 B2
(45) Date of Patent: Sep. 27, 2016

(54) METHOD, DEVICE AND STORAGE MEDIUM FOR CONTROLLING ANTENNA

(71) Applicant: Xiaomi Inc., Beijing (CN)

(72) Inventors: Xinming Shi, Beijing (CN); Zhenghai Wu, Beijing (CN); Wei Sun, Beijing (CN)

(73) Assignee: XIAOMI INC., Haidian District, Beijing (CN)

(*) Notice: Subject to any disclaimer, the term of this patent is extended or adjusted under 35 U.S.C. 154(b) by 119 days.

(21) Appl. No.: 14/271,461

(22) Filed: May 7, 2014

(65) Prior Publication Data

US 2015/0022405 A1 Jan. 22, 2015

Related U.S. Application Data

(63) Continuation of application No. PCT/CN2014/072274, filed on Feb. 19, 2014.

(30) Foreign Application Priority Data

Jul. 17, 2013 (CN) .......................... 2013 1 0300989

(51) Int. Cl.
  *G01R 29/10* (2006.01)
(52) U.S. Cl.
  CPC .................... *G01R 29/10* (2013.01)
(58) Field of Classification Search
  CPC .... H01Q 1/1257; H01Q 1/241; H01Q 1/242; H01Q 1/243; H01Q 1/50; H01Q 3/267; H01Q 23/00; G01R 29/10
  USPC ........................................................ 343/703
  See application file for complete search history.

(56) References Cited

U.S. PATENT DOCUMENTS 5,589,844 A * 12/1996 Belcher .................. H01Q 23/00
                                                      333/17.3
6,917,790 B1 * 7/2005 Braun ..................... H01Q 1/242
                                                      455/101

(Continued)

FOREIGN PATENT DOCUMENTS

CN       101605340 A    12/2009
CN       201854284 U     6/2011

(Continued)

OTHER PUBLICATIONS

"International Search Report for PCT/CN2014/072274".

*Primary Examiner* — Sue A Purvis
*Assistant Examiner* — Patrick Holecek
(74) *Attorney, Agent, or Firm* — Jun He Law Offices P.C.; James J. Zhu

(57) ABSTRACT

The embodiments of the present disclosure provide a method for controlling an antenna of a terminal device. The method comprises: acquiring an environmental state parameter of a terminal device; extracting an antenna performance parameter corresponding to the environmental state parameter from a preset antenna performance parameter table; and adjusting an antenna signal of the terminal device using the antenna performance parameter. According to the embodiment of the disclosure, a preferable antenna performance parameter may be obtained by acquiring the environmental state parameter of the location where the terminal device is located, and the antenna is adjusted according to the preferable antenna performance parameter, thereby achieving an intelligent adjustment of the antenna and adapting to the environmental change, thus the antenna is highly practical, strongly adaptive as well as efficient in operation.

18 Claims, 5 Drawing Sheets

(56) References Cited

U.S. PATENT DOCUMENTS

| | | | | |
|---|---|---|---|---|
| 8,537,055 B2* | 9/2013 | Waku | ............ | G06K 19/0723 343/702 |
| 8,712,340 B2* | 4/2014 | Hoirup | ............ | H01Q 1/242 455/67.11 |
| 2011/0130137 A1 | 6/2011 | Sanders et al. | | |

FOREIGN PATENT DOCUMENTS

| | | |
|---|---|---|
| CN | 102142869 A | 8/2011 |
| CN | 102710275 A | 10/2012 |
| CN | 102752007 A | 10/2012 |
| CN | 103155280 A | 6/2013 |

* cited by examiner

METHOD, DEVICE AND STORAGE MEDIUM FOR CONTROLLING ANTENNA

CROSS REFERENCE TO RELATED APPLICATION

This application is a Continuation of International Application PCT/CN2014/072274, with an international filing date of Feb. 19, 2014, which claims the priority of Chinese patent application No. 201310300989.3, filed on Jul. 17, 2013, the entire content of which is incorporated herein by reference.

TECHNICAL FIELD

The application relates to a field of terminal device, and more particularly, to a method, a terminal device and a storage medium for controlling an antenna of the terminal device.

BACKGROUND

As terminal devices are spreading in popularity, almost everyone has a terminal device. Moreover, the usage of terminal devices in people's daily life, such as work, study, amusement and the like, has become increasingly popular. That is, the terminal device is becoming a necessity of people's life.

Generally, an antenna of the terminal device is adjusted under a certain environment. Under this certain environment, the performance of the antenna may be optimal. Under a normal environment, the performance of the antenna will not be much of a problem, however, during a harsh environment, such as rainy day, cloudy day, or being in valley, or while the terminal device is held by a hand, etc., the antenna may not be suitable for the harsh environment so that problems may occur, such as poor signals, call drop, offline and the like.

SUMMARY

The embodiments of the disclosure provide a method for controlling an antenna of a terminal device, a terminal device and a storage medium thereof.

According to a first aspect of the embodiments of the disclosure, there is provided a method for controlling an antenna of a terminal device, comprising: acquiring an environmental state parameter of the terminal device; extracting an antenna performance parameter corresponding to the environmental state parameter from a preset antenna performance parameter table; and adjusting an antenna signal of the terminal device using the antenna performance parameter.

According to a second aspect of the embodiments of the disclosure, there is provided a terminal device with an antenna, comprising: a processor; a memory for storing instruction executable by the processor, for perform a method comprising: acquiring an environmental state parameter of the terminal device; extracting an antenna performance parameter corresponding to the environmental state parameter from a preset antenna performance parameter table; and adjusting an antenna signal of the terminal device using the antenna performance parameter.

According to a third aspect of the embodiments of the disclosure, there is provided a non-transitory computer-readable storage medium having stored therein instructions that, when executed by a processor of a terminal device, causes the terminal device to perform method for controlling an antenna, the method comprising: acquiring an environmental state parameter of the terminal device; extracting an antenna performance parameter corresponding to the environmental state parameter from a preset antenna performance parameter table; and adjusting an antenna signal of the terminal device using the antenna performance parameter.

The solutions according to embodiments of the disclosure may; in part, have the following advantages.

According to embodiments of the disclosure, a matched preferable antenna performance parameter may be obtained by acquiring the environmental state parameter of the location where the terminal device is located. Moreover the antenna is adjusted according to the preferable antenna performance parameter, thus achieving intelligent adjustment, adaptability to environmental change, high practicability, and strong adaptability as well as improved operation efficiency of the antenna.

According to embodiments of the disclosure, in a harsh environment, the intelligent adjustment may be performed to enhance the antenna signal strength and the performance of the terminal device, so as to reduce the occurrence of problems such as call drop, offline and the like.

According to embodiments of the disclosure, in a good environment, the intelligent adjustment may be performed to reduce the resource consumed by the antenna and to improve the efficiency of the terminal device.

It should be understood that both the above general descriptions and the detailed description hereinafter are only for exemplary and illustrative purposes, rather than to limit the present disclosure.

BRIEF DESCRIPTION OF THE DRAWINGS

In order to illustrate the technical solutions of the embodiments of the present disclosure more apparently, a brief description of the drawings will be given below. Obviously, the drawings described below only illustrate some embodiments of the present disclosure, and for those skilled in the art, other drawings may be obtained based on these drawings without inventive effort.

The drawings are incorporated into the description and are a part of the description. The drawings illustrate some embodiments of the invention and explain the principle of the invention together with the description.

DESCRIPTION OF THE EMBODIMENTS

A clear and thorough description will be given to the technical solution of the present disclosure with reference to the accompanying drawings of the present disclosure. Obviously, the illustrated embodiments are not all of the embodiments of the present disclosure, but only a part of them. According to the embodiments of the present disclosure, all other embodiments obtained by those skilled in the art without any creative effort fall within the protection scope of the present disclosure.

In the present disclosure, a terminal device detects its environment through a sensor thereof to adjust antenna performance in real time, so that the antenna may gain optimal performance.

Figure 1:
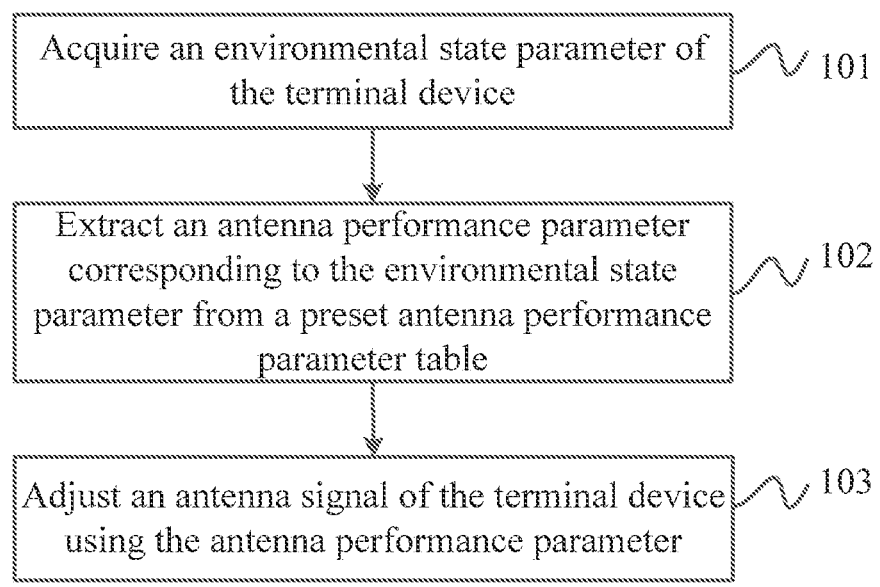
FIG. 1 is a flowchart of a method for controlling an antenna of a terminal device according to an embodiment of the disclosure.

FIG. 1 is a flowchart of a method for controlling an antenna of a terminal device according to an embodiment of the disclosure. The method may be used in the terminal device such as a mobile terminal and may include the following steps.

At step S101, an environmental state parameter of the terminal device is acquired.

At step S102, an antenna performance parameter corresponding to the environmental state parameter is extracted from a preset antenna performance parameter table.

At step S103, an antenna signal of the terminal device is adjusted by using the antenna performance parameter.

It should be noted that the terminal device may be any suitable terminal device such as a tablet PC, a PDA, a mobile phone and the like, which is not limited in the embodiments of the disclosure.

It should be understood that different environments have different characteristics. For example, humidity will increased significantly on a rainy day; air pressure will decreased significantly in a valley; and air temperature will be significantly different in different seasons. In the embodiments of the disclosure, the environmental state parameter, such as humidity, air pressure, temperature and the like may be obtained and the real environment may be represented by those data.

In an embodiment of the disclosure, the environmental state parameter may include at least one environmental state parameter of temperature, humidity and air pressure.

In a real application, the environmental state parameter may be any one or more of the temperature, the humidity and the air pressure.

Certainly, the above environmental state parameter is intended to be an example and may include other parameters according to specific circumstances, which is not limited in the embodiments of the disclosure.

In the real application, the terminal device may be provided with a sensor to acquire the environmental state parameter.

In an embodiment of the disclosure, the terminal device may be provided with a sensor. Step S101 may include the following sub-steps.

At sub-step S11, antenna signal strength of the terminal device is monitored.

At sub-step S12, when the antenna signal strength is less than a first preset threshold, the environmental state parameter monitored by the sensor is acquired.

If the antenna signal strength is less than the first preset threshold, the terminal device is in a relatively harsh environment and the antenna performance thereof is affected. Therefore, the antenna performance needs to be enhanced to ensure normal use of the terminal device. Certainly, the first preset threshold may be set by the person skilled in the art based on real conditions, which is not limited in the embodiments of the disclosure.

It should be understood that the sensor arranged in the terminal device might be at least one of a temperature sensor, a humidity sensor, and an air pressure sensor, which corresponds to the environmental state parameter to be acquired.

According to the embodiment of the disclosure, an intelligent adjustment may be performed in the harsh environment to enhance the antenna signal strength and the performance of the terminal device, so as to reduce the occurrence of problems such as call drop, offline and the like.

In an embodiment of the disclosure, the terminal device may be provided with a sensor. Step S101 may include the following sub-steps.

At sub-step S21, antenna signal strength of the terminal device is monitored.

At sub-step S22, when the antenna signal strength is greater than a second preset threshold, the environmental state parameter monitored by the sensor is acquired.

If the antenna signal strength is greater than a second preset threshold, the terminal device is in a relatively good environment. Therefore, in a case that normal use of the terminal device may be ensured, the resource consumed by the antenna may be reduced to improve the experience of a user. Certainly, the second preset threshold may be set by the person skilled in the art based on real conditions, which is not limited in the embodiments of the disclosure.

It should be understood that the sensor arranged in the terminal device might be at least one of a temperature sensor, a humidity sensor, and an air pressure sensor, which corresponds to the environmental state parameter to be acquired.

According to the embodiment of the disclosure, the intelligent adjustment may be performed in the good environment to reduce the resource consumed by the antenna, so as to improve the efficiency of the terminal device.

Certainly, the above environmental state parameter is intended to be an example and other manners of acquiring the environmental state parameter may be used according to specific circumstances, which is not limited in the disclosure. For example, the environmental state parameter may be acquired uninterruptedly or at an interval.

The sensor acquires the environmental state parameter, and then uploads the acquired environmental state parameter to a CPU of the terminal device to be processed.

Different environments have different degrees of effect on the antenna of the terminal device when the terminal device is in the different environments, so that requirements on the antenna are different and thus the corresponding antenna performance parameters are different. For example, the antenna signal is relatively poor when the user with the terminal device enters a valley, so that corresponding adjustment is required to enhance the antenna signal strength; while the antenna signal is relatively strong when the user with the terminal device goes out of the valley and enter into a town, a corresponding adjustment aimed at the previous adjustment is required to reduce the resource consumed by the antenna.

According to an embodiment of the disclosure, a preset antenna performance parameter table may store one or more antenna performance parameters which may be preferable antenna performance parameters obtained under various virtual-reality environments in a laboratory. Such preferable antenna performance parameters may be an antenna performance parameter when the antenna signal is the strongest, or an antenna performance parameter when the efficiency of the antenna is the highest, or an antenna performance parameter when the radiation of the antenna is the lowest or the like, which is not limited in the disclosure.

According to the embodiment of the disclosure, a preferable antenna performance parameter may be obtained by acquiring the environmental state parameter of the location where the terminal device is located, and the antenna is adjusted according to the preferable antenna performance parameter, thereby achieving an intelligent adjustment of the antenna and adapting to the environmental change, thus the antenna is highly practical, strongly adaptive as well as efficient in operation.

In an embodiment of the disclosure, the antenna performance parameter may include at least one antenna performance parameter of radiation power, radiation sensitivity, antenna gain and the pattern of the antenna.

For example, the antenna performance parameter may be one or more and the like of radiation power, radiation sensitivity, antenna gain and the pattern of the antenna.

Certainly, the above antenna performance parameter is intended to be an example and may include other parameters according to specific circumstances, which is not limited in the disclosure.

In an embodiment of the disclosure, the preset antenna performance parameter table may be stored in a Non-Volatile Random Access Memory (NVRAM) of the terminal device.

For example, a partition may be established in a memory chip of the terminal device, to store the NVRAM which may be used to store the preferable antenna performance parameters obtained under various virtual-reality environments in the laboratory.

Certainly, the above manner for storing the preset antenna performance parameter table is intended to be an example and other manners for storing the preset antenna performance parameter table may be used according to specific circumstances, which is not limited in the disclosure.

Certainly, the above antenna performance parameter is intended to be an example and other parameters may be set according to specific circumstances, which is not limited in the disclosure.

In an embodiment, the preset antenna performance parameter table may include one or more preset reference environment parameters, and the step S102 may include the following steps.

At sub-step S31, differences between the environmental state parameter and each of the preset reference environment parameters are calculated respectively.

At sub-step S32, the antenna performance parameter corresponding to the reference environment parameter is extracted when the differences meet a first preset condition.

It should be noted that the antenna performance parameter in the embodiment of the disclosure is one or more preferable antenna performance parameters obtained through testing in environments indicated by one or more reference environment parameters, respectively.

The reference environment parameter in the embodiment of the disclosure may include at least one reference environment parameter of temperature, humidity and air pressure, which corresponds to the acquired environmental state parameter.

The reference environment parameter in the embodiment of the disclosure may be discrete points. For example:

| No. | Temperature (° C.) | Humidity (%) | Air pressure (atm) |
|-----|--------------------|--------------|--------------------|
| 1   | 25                 | 60           | 1                  |
| 2   | 30                 | 60           | 1                  |
| 3   | 35                 | 65           | 1                  |

According to the embodiment, the antenna performance parameter is obtained through calculating differences between the environmental state parameter and each of the preset reference environment parameters respectively. For example, if the acquired environmental state parameter A includes temperature of 28° C., humidity of 62% and air pressure of 1 atm, differences between temperature, humidity and air pressure in the environmental state parameter and those in the reference environment parameter are calculated respectively.

The preset first condition in the embodiment of the disclosure may include a minimum difference or a minimum difference obtained based on weights assigned on priority.

The minimum difference means that the real environment indicated by the environmental state parameter is most similar to the environment simulated in the laboratory indicated by the reference environment parameter. For example the environmental state parameter A is similar to the reference environment parameter No. 2, and the antenna performance parameter corresponding to the reference environment parameter may be used as the corresponding antenna performance parameter.

Different parameters have different effects on the antenna performance. The weights are assigned based on priority, so that the real environment indicated by the environmental state parameter may be closer to the environment simulated in the laboratory indicated by the reference environment parameter. The minimum difference, which is obtained based on weights assigned on priority, may indicate that the real environment indicated by the environmental state parameter is the most similar to the environment simulated in the laboratory indicated by the reference environment parameter, and the antenna performance parameter corresponding to the reference environment parameter may be used as the antenna performance parameter.

Assume that the temperature has more effect than the humidity, a higher weight coefficient may be assigned to the temperature and a lower weight coefficient may be assigned to the humidity when calculating the differences. As a result, the environmental state parameter A may correspond with the reference environment parameter No. 1.

Certainly, the above preset condition is intended to be an example and other conditions may be set according to specific circumstances as long as an antenna performance parameter suitable for the current environment may be obtained correspondingly which is not limited in the disclosure.

In an embodiment, the preset ante performance parameter table may include one or more preset reference environment parameter intervals. Step S102 may include the following sub-steps.

At sub-step S41, a preset reference environment parameter interval, in which the environmental state parameter falls, is searched for.

At sub-step S42, an antenna performance parameter corresponding to the preset reference environment parameter interval is extracted.

It should be noted that, the antenna performance parameter interval is one or more preferable antenna performance parameter obtained through tests in environments indicated by one or more reference environment parameter intervals.

The reference environment parameter interval in the embodiment may include at least one reference environment parameter interval for the temperature, the humidity and the air pressure, which corresponds to the acquired environmental state parameter in the embodiment.

In the embodiment of the disclosure, the reference environment parameter may be an interval. For example:

| No. | Temperature (° C.) | Humidity (%) | Air pressure (atm) |
|---|---|---|---|
| 4 | 25-30 | 60-70 | 0.9-1.0 |
| 5 | 30-35 | 60-70 | 0.9-1.0 |
| 6 | 35-45 | 65-75 | 0.85-0.95 |

In the embodiment, the reference environment parameter interval in which the environmental state parameter falls is searched for. For example the acquired environmental state parameter A includes temperature of 26° C., humidity of 65% and air pressure of 1 atm, and thus the environmental state parameter A belongs to the reference environment parameter interval No. 4. Therefore, the antenna performance parameter corresponding to the reference environment parameter interval No. 4 may be extracted.

In an embodiment of the disclosure, the preset antenna performance table may include one or more preset reference environment parameters and corresponding reference antenna signal strength. Step S102 may include the following sub-steps.

At sub-step S51, a fitting is performed between the environmental state parameter and respective reference environment parameters.

At sub-step S52, if a similarity of the fitting is greater than a third threshold, a corresponding adjustment is performed on the antenna performance parameter corresponding to the reference environment parameters using a fitting result, so as to acquire the antenna performance parameter corresponding to the reference environment parameters.

Alternatively, Step S102 may include the following sub-steps.

At sub-step 61, a fitting is performed between current antenna signal strength and respective reference antenna signal strength.

At sub-step 62, if a similarity of the fitting is greater than a third threshold, a corresponding adjustment is performed on the antenna performance parameter corresponding to the reference environment parameters using a result of the fitting.

At sub-step 63, the antenna performance parameter corresponding to the reference environment parameters is acquired.

It should be understood that if there is a large difference between the environmental state parameter acquired by the terminal device and the reference environment parameter, i.e., the terminal device is located in a complex environment, which significantly differs from an experimental simulation environment, a data fitting algorithm may be performed according to the embodiment of the disclosure, so that the environmental state parameter is as close to the reference environment parameter as possible.

There is a correspondence between the current antenna signal strength and the environmental state parameter, and there also is a correspondence between the reference signal strength and the reference environment parameter, therefore the fitting may be performed using the environmental state parameter and the reference environment parameter, as well as the current antenna signal strength and the reference signal strength.

It should be noted that the current antenna signal strength may be instantaneous antenna signal strength or mean antenna signal strength in a period, which is not limited in the disclosure.

There may be an allocation factor and the like during the fitting. In order to compensate the effect of the allocation factor and the like, a corresponding adjustment may be performed on the antenna performance parameter corresponding to the successfully fitted reference environment parameter, and the adjusted antenna performance parameter is the antenna performance parameter which corresponds with the environmental state parameter.

Certainly, the above manner for extracting the corresponding antenna performance parameter is intended to be an example and other manners for extracting the corresponding antenna performance parameter may be used according to specific circumstances, which is not limited in the disclosure.

When the antenna performance parameter is acquired, the corresponding adjustment is performed with the antenna performance parameter to obtain a desired antenna signal.

For example, if the antenna performance parameter is only RF transmitting and receiving power of the antenna signal, power of a radio transmitter and a radio receiver is adjusted to be the acquired RF transmitting and receiving power, so as to correspondingly increase or reduce the antenna signal strength.

For clarity, embodiments of the method are described as combination of a series of actions. However, the person skilled in the art should appreciate that the embodiments of the disclosure are not limited to the order of the described actions, and some steps may be performed in other order or simultaneously. Additionally, the person skilled in the art should appreciate that the embodiments described herein are preferable embodiments and some related actions may not be necessary.

Figure 2:
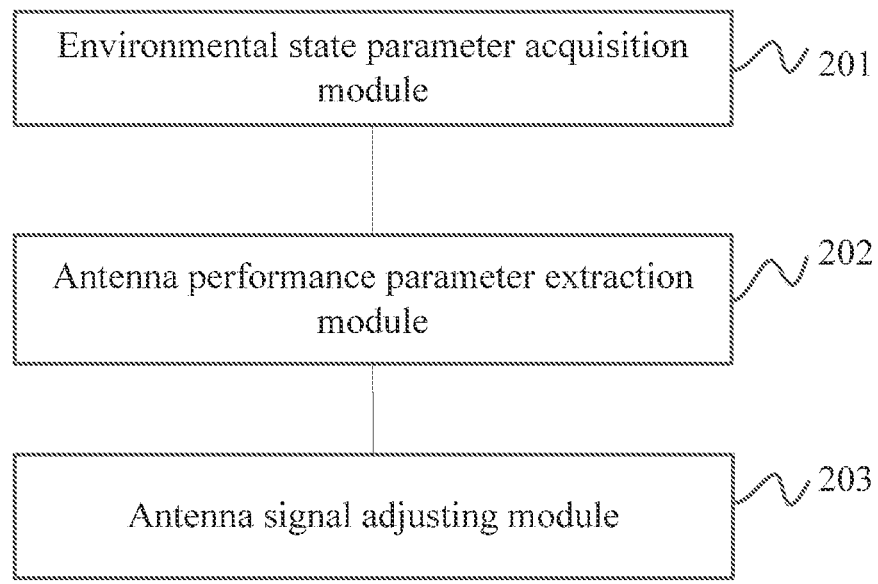
FIG. 2 is a block diagram of an apparatus for controlling an antenna of a terminal device according to an embodiment of the disclosure.

Referring to FIG. 2, which is a block diagram of an apparatus for controlling an antenna of a terminal device according to an embodiment of the disclosure, the apparatus may include the following modules.

An environmental state parameter acquisition module 201 is configured to acquire an environmental state parameter.

An antenna performance parameter extraction module 202 is configured to extract an antenna performance parameter corresponding to the environmental state parameter from a preset antenna performance parameter table.

An antenna signal adjusting module 203 is configured to adjust an antenna signal of the terminal device using the antenna performance parameter.

In an embodiment of the disclosure, the preset antenna performance parameter table may be stored in a Non-Volatile Random Access Memory (NVRAM) of the terminal device.

Figure 3:
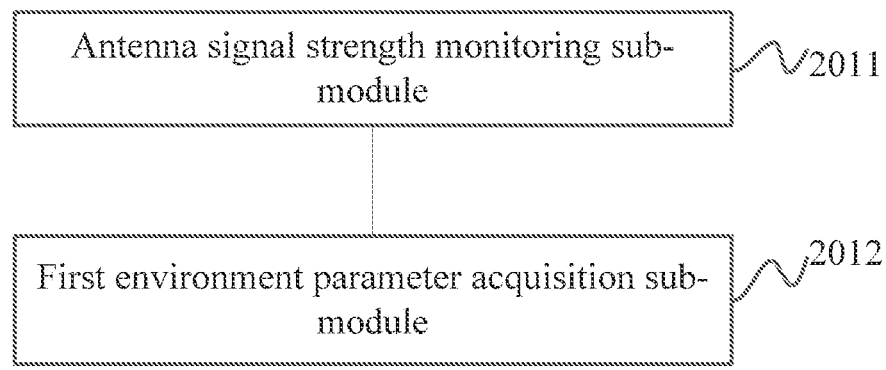
FIG. 3 is a block diagram of an environmental state parameter acquisition module in an example according to an embodiment of the disclosure.

FIG. 3 is a block diagram of an environmental state parameter acquisition module in an example according to an embodiment of the disclosure. In this embodiment, the terminal device is provided with a sensor, and the environmental state parameter acquisition module 201 may include the following sub-modules.

An antenna signal strength monitoring sub-module 2011 is configured to monitor antenna signal strength of the terminal device.

A first environment parameter acquisition sub-module 2012 is configured to acquire the environmental state parameter monitored by the sensor when the antenna signal strength is less than a first preset threshold.

Figure 4:
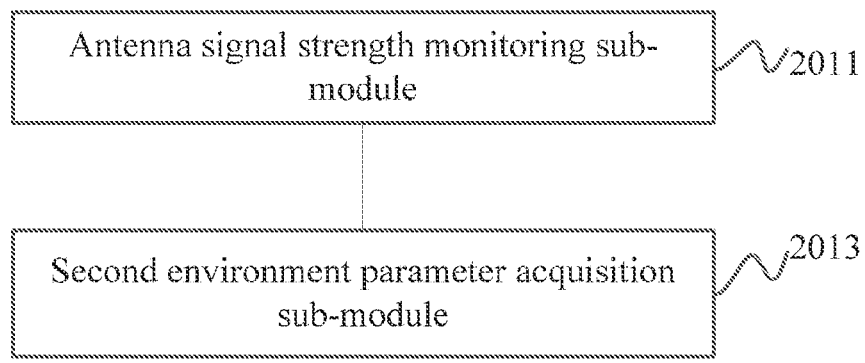
FIG. 4 is a block diagram of an environmental state parameter acquisition module in an example according to an embodiment of the disclosure.

FIG. 4 is a block diagram of an environmental state parameter acquisition module in an example according to an embodiment of the disclosure. In this embodiment, the terminal device is provided with a sensor, and the environmental state parameter acquisition module 201 may include the following sub-modules.

An antenna signal strength monitoring sub-module 2011 is configured to monitor antenna signal strength of the terminal device.

A second environment parameter acquisition sub-module 2013 is configured to acquire the environmental state parameter monitored by the sensor when the antenna signal strength is greater than a second preset threshold.

Figure 5:
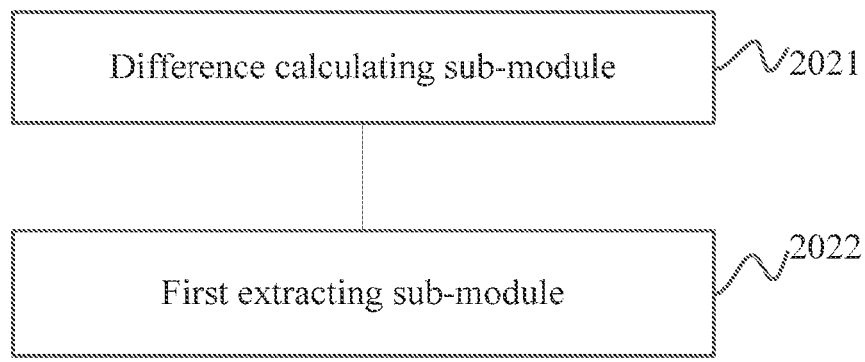
FIG. 5 is a block diagram of an antenna performance parameter extraction module in an example according to an embodiment of the disclosure.

FIG. 5 is a block diagram of an antenna performance parameter extraction module in an example according to an embodiment of the disclosure. In this embodiment, the preset antenna performance parameter table may store one or more preset reference environment parameters, and the antenna performance parameter acquisition module 202 may include the following sub-modules.

A difference calculating sub-module 2021 is configured to calculate differences between the environmental state parameter and each of the preset reference environment parameters respectively.

A first extracting sub-module 2022 is configured to extract the antenna performance parameter corresponding to the reference environment parameter when the differences meet a preset condition which includes a minimum difference or a minimum difference obtained based on weights assigned on priority.

Figure 6:
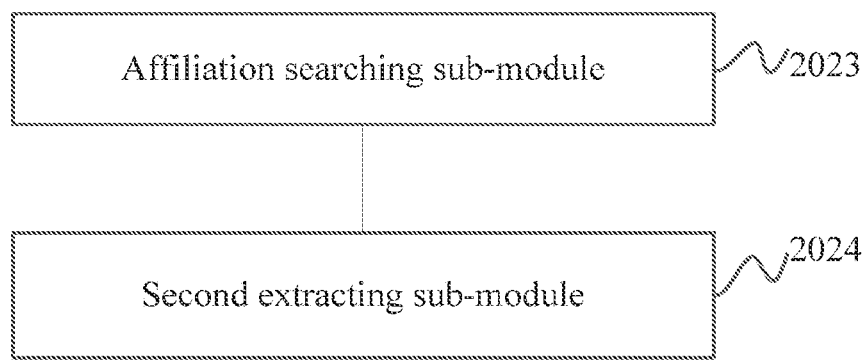
FIG. 6 is a block diagram of an antenna performance parameter extraction module in an example according to an embodiment of the disclosure.

FIG. 6 is a block diagram of an antenna performance parameter extraction module in an example according to an embodiment of the disclosure. In this embodiment, the preset antenna performance parameter table may include one or more preset reference environment parameter intervals, and the antenna performance parameter acquisition module 202 may include the following sub-modules.

An affiliation searching sub-module 2023 is configured to search for a reference environment parameter interval in which the environmental state parameter falls.

A second extracting sub-module 2024 is configured to extract the antenna performance parameter corresponding to the reference environment parameter interval.

Figure 7:
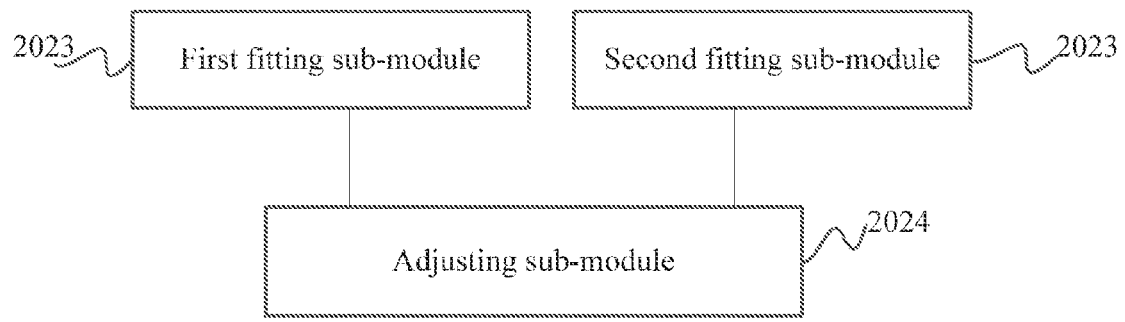
FIG. 7 is a block diagram of an antenna performance parameter extraction module in an example according to an embodiment of the disclosure.

FIG. 7 is a block diagram of an antenna performance parameter extraction module an example according to an embodiment of the disclosure, in this embodiment, the preset antenna performance parameter table may include one or more preset reference environment parameters and corresponding reference antenna signal strength, and the antenna performance parameter acquisition module 202 may include the following sub-modules.

A first fitting sub-module 2025 is configured to perform a fitting between the environmental state parameter and respective reference environment parameters.

A second fitting sub-module 2026 is configured to perform a fitting between current antenna signal strength and respective reference antenna signal strength.

An adjusting sub-module 2027 is configured to perform a corresponding adjustment on the antenna performance parameter corresponding to the reference environment parameters using a result of the fitting if a similarity of the fitting is greater than a third threshold.

An acquiring sub-module 2028 is configured to acquire the antenna performance parameter corresponding to the reference environment parameters.

In an embodiment of the disclosure, the environmental state parameter may include at least one environmental state parameter of humidity, air pressure, temperature.

In an embodiment of the disclosure, the antenna performance parameter may include at least one antenna performance parameter of radiation power, radiation sensitivity, antenna gain and the pattern of the antenna.

According to the embodiment of the disclosure, a preferable antenna performance parameter may be obtained by acquiring the environmental state parameter of the location where the terminal device is located, and the antenna is adjusted according to the preferable antenna performance parameter, thereby achieving an intelligent adjustment of the antenna and adapting to the environmental change, thus the antenna is highly practical, strongly adaptive as well as efficient in operation.

According to the embodiment of the application, an intelligent adjustment may be performed in a harsh environment to enhance the antenna signal strength and the performance of the terminal device, so as to reduce the occurrence of problems such as call drop, offline and the like.

According to the embodiment of the application, an intelligent adjustment may be performed in a good environment to reduce the resource consumed by the antenna and to improve the efficiency of the terminal device The embodiments of the apparatus is similar to those of the method, therefore the description thereof is brief and the detailed description may refer to that of the embodiments of the method.

The disclosure also provides a terminal device including: one or more processors; a memory; and one or more instruction modules configured to be stored in the memory and to be performed by the one or more processors, and the one or more instruction modules are configured to perform the following functions: acquiring an environmental state parameter; extracting an antenna performance parameter corresponding to the environmental state parameter from a preset antenna performance parameter table; and adjusting an antenna signal of the terminal device using the antenna performance parameter.

For example, the preset antenna performance parameter table may be stored in a Non-Volatile Random Access Memory (NVRAM) of the terminal device.

For example, the terminal device is provided with a sensor, and the one or more modules may be configured to perform the following functions: monitoring the antenna signal strength of the terminal device; and acquiring the environmental state parameter monitored by the sensor when the antenna signal strength is less than a first preset threshold.

For example, the terminal device is provided with a sensor, and the one or more modules may be configured to perform the following functions: monitoring the antenna signal strength of the terminal device; and acquiring the environmental state parameter monitored by the sensor when the antenna signal strength is greater than a second preset threshold.

For example, the preset antenna performance parameter table may store one or more preset reference environment parameters, and the one or more modules may be configured to perform the following functions: calculating differences between the environmental state parameter and each of the preset reference environment parameters respectively; extracting the antenna performance parameter corresponding to the reference environment parameter when the differences meet a preset condition which includes a minimum difference or a minimum difference obtained based on weights assigned on priority.

For example, the preset antenna performance parameter table may include one or more preset reference environment parameter intervals, and the one or more modules may be configured to perform the following functions: searching for a reference environment parameter interval in which the environmental state parameter falls; extracting the antenna performance parameter corresponding to the reference environment parameter interval.

For example, the preset antenna performance parameter table may include one or more preset reference environment parameters and corresponding reference antenna signal strength, and the one or more modules may be configured to perform the following functions: performing a fitting between the environmental state parameter and each of the preset reference environment parameter respectively and respective reference antenna signal strength; performing a corresponding adjustment on the antenna performance parameter corresponding to the reference environment parameters using a fitting result if a similarity of the fitting is greater than a third threshold, so as to acquire the antenna performance parameter corresponding to the reference environment parameters.

For example, the environmental state parameter may include at least one environmental state parameter of humidity, air pressure, temperature.

For example, the antenna performance parameter may include at least one antenna performance parameter of radiation power, radiation sensitivity, antenna gain and the pattern of the antenna.

According to the embodiment of the disclosure, a preferable antenna performance parameter may be obtained by acquiring the environmental state parameter of the location where the terminal device is located, and the antenna is adjusted according to the preferable antenna performance parameter, thereby achieving an intelligent adjustment of the antenna and adapting to the environmental change, thus the antenna is highly practical, strongly adaptive as well as efficient in operation.

According to the embodiment of the application, an intelligent adjustment may be performed in a harsh environment to enhance the antenna signal strength and the performance of the terminal device, so as to reduce the occurrence of problems such as call drop, offline and the like.

According to the embodiment of the application, an intelligent adjustment may be performed in a good environment to reduce the resource consumed by the antenna and to improve the efficiency of the terminal device.

The disclosure also provides to a non-transitory computer-readable storage medium having stored therein one or more programs. When applied to a terminal device with an antenna, the one or more programs allow the terminal device to perform the following instructions: acquiring an environmental state parameter; extracting an antenna performance parameter corresponding to the environmental state parameter from a preset antenna performance parameter table; and adjusting an antenna signal of the terminal device using the antenna performance parameter.

For example, the preset antenna performance parameter table may be stored in a Non-Volatile Random Access Memory (NVRAM) of the terminal device.

For example, the terminal device is provided with a sensor, and the one or more modules may be configured to perform the following instructions: monitoring the antenna signal strength of the terminal device; and acquiring the environmental state parameter monitored by the sensor when the antenna signal strength is less than a first preset threshold.

For example, the terminal device is provided with a sensor, and the one or more modules may be configured to perform the following instructions: monitoring the antenna signal strength of the terminal device; and acquiring the environmental state parameter monitored by the sensor when the antenna signal strength is greater than a second preset threshold.

For example, the preset antenna performance parameter table may store one or more preset reference environment parameters, and the one or more modules may be configured to perform the following instructions: calculating differences between the environmental state parameter and each of the preset reference environment parameters respectively; extracting the antenna performance parameter corresponding to the reference environment parameter when the differences meet a preset condition which includes minimum difference or a minimum difference obtained based on weights assigned on priority.

For example, the preset antenna performance parameter table may include one or more preset reference environment parameter intervals, and the one or more modules may be configured to perform the following instructions: searching a reference environment parameter interval in which the environmental state parameter falls; extract the antenna performance parameter corresponding to the reference environment parameter interval.

For example, the preset antenna performance parameter table may include one or more preset reference environment parameters and corresponding reference antenna signal strength, and the one or more modules may be configured to perform the following instructions: performing a fitting between the environmental state parameter and each of the preset reference environment parameter respectively or between a current antenna signal strength and each of the reference antenna signal strength; performing a corresponding adjustment on the antenna performance parameter corresponding to the reference environment parameters using a result of the fitting if a similarity of the fitting is greater than a third threshold; and acquiring the antenna performance parameter corresponding to the reference environment parameters.

For example, the environmental state parameter may include at least one environmental state parameter of humidity, air pressure, temperature.

For example, the antenna performance parameter may include at least one antenna performance parameter of radiation power, radiation sensitivity, antenna gain and the pattern of the antenna.

Figure 8:
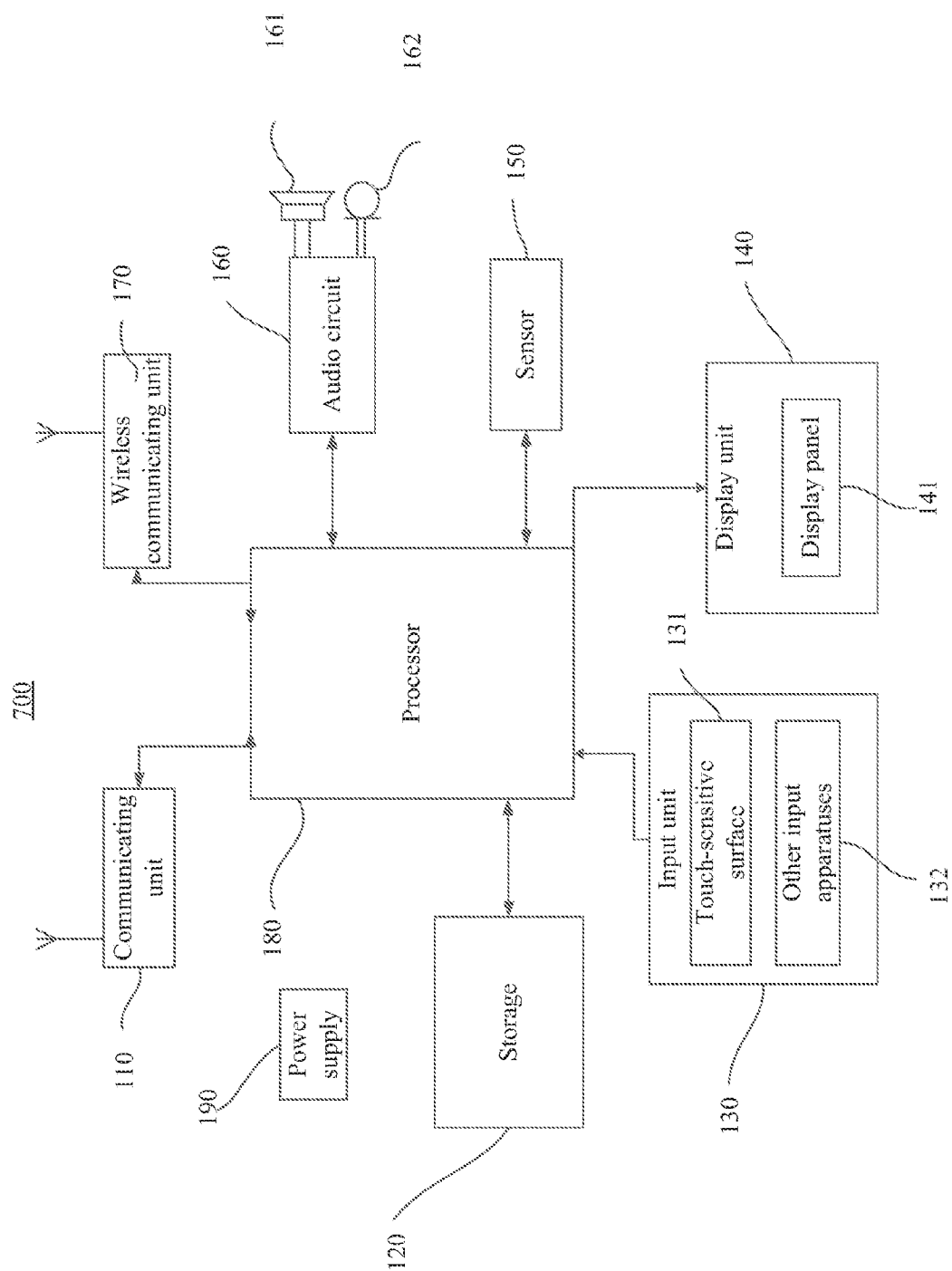
FIG. 8 is a block diagram of a terminal device according to an embodiment of the disclosure.

FIG. 8 is a block diagram of a terminal device according to an embodiment of the disclosure. Referring to FIG. 8, the terminal device may be used to perform the method for controlling the antenna of the terminal device described in above embodiments. The terminal device may be a mobile phone, a pad, a wearable terminal device (such as a smart watch), a computer, a digital broadcast terminal, a messaging device, a gaming console, a tablet, a medical device, exercise equipment, a personal digital assistant and the like.

Preferably, the terminal device 700 may include a communication unit 110, one or more computer readable memories 120, an input unit 130, a display unit 140, a sensor 150, an audio circuit 160, a wireless fidelity (WIFI) module 170, one or more processors 180 and a power supply 190 and the like. The person skilled in the art should appreciate that the structure shown in FIG. 5 is not intended to limit the terminal device. The terminal device may include less or more components than those shown in FIG. 8, or include a combination of some components, or include various component arrangement.

The communication unit 110 may be configured to send and receive signals during sending and receiving of information or a process of calling. The communication unit 110 may be a network communication device such as a Radio Frequency (RF) circuit, a router, a modem and the like. In particular, if the communication unit 110 is the RF circuit, the communication unit 110 receives downlink information from a base station and then transmits the information to the one or more processors 180 to be processed if the communication unit 110 is the RF circuit; and transmits the related uplink data to the base station. Generally, the RP circuit serves as the communication unit includes, but is not limited to, an antenna, at least one amplifier, a tuner, one or more oscillators, a Subscriber Identity Module (SIM) card, a transceiver, a coupler, a Low Noise Amplifier (LNA), a duplexer and the like. Additionally, the communication unit 110 may also communicate with a network or other devices via a wireless network. The wireless network may adopt any one of communication standard or protocol including, but not limited to, Global System of Mobile communication (GSM), General Packet Radio Service (GPRS), Code Division Multiple Access (CDMA), Wideband Code Division Multiple Access (WCDMA), Long Term Evolution (LTE), email, Short Messaging Service (SMS) and the like. The memory 120 may be configured to store programs and modules. The processor 180 performs various functions and processes data through operating programs and modules stored in the memory 120. The memory 120 may include a program storage area and a data storage area. The program storage area may store an operating system, at least one application program required by at least one function (such as sound play function, image play function and the like). The data storage area may store data created based on the operation of the terminal device 700 (such as audio data, a phone book and the like). In addition, the memory 120 may include a high speed random access memory. The memory 120 may also include a nonvolatile memory (NVM), such as at least one disk storage, flash memory or other nonvolatile solid-state memory. Correspondingly, the memory 120 may also include a memory controller to control access to the memory 120 performed by the processor 180 and the input unit 130.

The input unit 130 may be used to receive input information of numbers or characters and to generate signal input through a keyboard, a mouse, an operating rod, optical or trackball related to user settings and function control. For example, the input unit 130 may include a touch sensitive surface 131 and other input device 132. The touch sensitive surface 131, also called a touch screen or a track pad, may collect touch operation on or near it (for example, the user performs operation on or near the touch sensitive surface 131 with a finger, a touch pen or any suitable object or attachment), and drive a corresponding connection device according to a preset program. Alternatively, the touch sensitive surface 131 may include two parts, i.e., a touch detecting device and a touch controller. The touch detecting device detects a touch orientation performed by the user and signals from the touch operation, and transmits the signals to the touch controller. The touch controller receives the touch information from the touch detecting device and converts it into touch point coordinates and then transmits the coordinates to the processor 180. The touch controller also receives and performs instructions from the processor 180. Additionally, the touch sensitive surface 131 may be realized as a resistance touch sensitive surface, a capacitive touch sensitive surface, an infrared ray touch sensitive surface and a surface acoustic wave (SAW) touch sensitive surface and the like. The input unit 130 may also include other kind of input device 132 in addition to the input unit 130. For example, the other input device 132 may include, but not limited to, one or any combination of a physical keyboard, a function key (such as a volume control key, an on/off key and the like), a trackball, a mouse, an operating rod.

The display unit 140 may be used to display information to or from the user and respective graphic user interface (GUI) of the terminal device 700 which may be formed by an image, a text, an icon, a video and any combination of them. The display unit 140 may include a display panel 141. Optionally, the display panel 141 may be configured with a Liquid Crystal Display (LCD), an Organic Light-Emitting Diode (OLED) and the like. Furthermore, the touch sensitive surface 131 may be configured to cover the display panel 141. When detecting the touch operation performed on or near the touch sensitive surface 131, the touch sensitive surface 131 transmit signals to the processor 180 to determine a type of the touch event, then the processor 180 provides corresponding vision output on the display panel 141 according to the type of the touch event. Although the touch sensitive surface 131 and the display panel 141 are shown as two separate parts in FIG. 8 to perform input and output function, the touch sensitive surface 131 may be integrated with the display panel 141 in some embodiments to perform input and output function.

The terminal device 700 may also include at least one sensor 150 such as a photo sensor, a motion sensor and other sensors. For example, the photo sensor may include an ambient light sensor and a proximity sensor. The ambient light sensor may adjust brightness of the display panel 141 according to intensity of the ambient light. The proximity sensor may close the display panel and/or backlight when the terminal device 700 is close to the user's ear. As one type of motion sensors, a gravitational acceleration sensor may detect values of accelerations in various directions (usually three axes); may detect a value and a direction of the gravitation when resting; and may be used in an application for identifying a mobile phone pose (such as switching between a landscape mode and a vertical mode, corresponding games, pose adjusting with a magnetometer), functions related to vibration (such as a pedometer, knocking) and the like. Other sensors such as a gyroscope, a barometer, a hygrometer, a thermometer, an infrared sensor and the like which may be arranged in the terminal device 700 will not be described in detailed.

The audio circuit 160, a speaker 161, a microphone 162 may provide an audio interface between the user and the terminal device 700. The audio circuit 160 may convert the received audio data into electronic signals and transmit the electronic signals to the speaker 161, and the speaker 161 may convert the electronic signals into voice and output the voice. Additionally, the microphone 162 may convert the collected voice signals into electronic signals; the audio circuit 160 receives the electronic signals and converts them into audio data; and the audio data is transmitted to the processor 180 and then is transmitted to another terminal device via the RF circuit 110 after processed by the processor; or the audio data is transmitted to the memory 120 to be further processed. The audio circuit 160 may also include an earplug jack to allow communication between a peripheral earphone and the terminal device 700.

In order to perform wireless communication, the terminal device may be provided with the wireless communication unit 170 which may be a WIFI module. WIFI is a short-range wireless transmission technology. The mobile device 800 may implement the application of e-mail service, Web page and streaming medium browse using the WiFi module 170 which provides a broadband wireless communication with the Internet. Although the wireless communication unit 170 is shown in FIG. 8, it should be understood that the wireless communication unit 170 is not a necessary component of the terminal device 700 and may be omitted based on actual needs in scope of not t changing the principle of the disclosure.

The processor 180 is a control center of the terminal device 700 and is connected to respective parts of the whole mobile phone via various interfaces and line links, and performs various functions and processes data through operating or performing programs and/or modules stored in the memory 120 and calling data stored in the memory 120, so as to achieve an overall control on the mobile phone. Optionally, the processor 180 may include one or more processing cores. Preferably, the processor 180 may be integrated with an application processor and a modem. The application processor is mainly used to control the operation system, the use interface, applications and the like. The modem is mainly used to handle the wireless communication. It should be understood that the above modem may be provided independently of the processor 180.

The terminal device 700 may also include the power supply 190 (such as a battery) for providing power to each component. For example, the power supply may be logically connected to the processor 180 through a power control system, so that the power control system may implement a power charge-discharge management and a power consumption management. The power supply 190 may also include any components such as one or more DC or AC power supply, a recharge system, a power fault detecting circuit, a power adapter or inverter, a power status indicator and the like.

Although not shown, the terminal device 700 may also include a camera, a Bluetooth module, which will not described in detail. Specifically, the display unit of the terminal device is a touch screen display. The terminal device may also include the memory and one or more programs stored in the memory, and may be configured to perform the one or more programs through the one or more processors so as to perform the following instructions contained in the programs: acquiring an environmental state parameter; extracting an antenna performance parameter corresponding to the environmental state parameter from a preset antenna performance parameter table; and adjusting an antenna signal of the terminal device using the antenna performance parameter.

For example, the preset antenna performance parameter table may be stored in a Non-Volatile Random Access Memory (NVRAM) of the terminal device.

For example, the terminal device is provided with a sensor, and the memory may also include the following functions: monitoring the antenna signal strength of the terminal device; and acquiring the environmental state parameter monitored by the sensor when the antenna signal strength is less than a first preset threshold.

For example, the terminal device is provided with a sensor, and the memory may also include the following functions: monitoring the antenna signal strength of the terminal device; and acquiring the environmental state parameter monitored by the sensor when the antenna signal strength is greater than a second preset threshold.

For example, the preset antenna performance parameter table may store one or more presser reference environment parameters, and the one or more modules may be configured to perform the following functions: calculating differences between the environmental state parameter and each of the preset reference environment parameters respectively; extracting the antenna performance parameter corresponding to the reference environment parameter when the differences meet a preset condition which includes minimum difference or a minimum difference obtained based on weights assigned on priority.

For example, the preset antenna performance parameter table may include one or more preset reference environment parameter intervals, and the one or more modules may be configured to perform the following functions: searching for a reference environment parameter interval in which the environmental state parameter falls; extracting the antenna performance parameter corresponding to the reference environment parameter interval.

For example, the preset antenna performance parameter table may include one or more preset reference environment parameters and corresponding reference antenna signal strength, and the one or more modules may be configured to perform the following functions: performing a fitting between the environmental state parameter and each of the preset reference environment parameter respectively or between a current antenna signal strength and each of the reference antenna signal strength; performing a corresponding adjustment on the antenna performance parameter corresponding to the reference environment parameters using a result of the fitting if a similarity of the fitting is greater than a third threshold; and acquiring the antenna performance parameter corresponding to the reference environment parameters.

For example, the environmental state parameter may include at least one environmental state parameter of humidity, air pressure, temperature.

For example, the antenna performance parameter may include at least one antenna performance parameter of radiation power, radiation sensitivity, antenna gain and the pattern of the antenna.

Respective embodiments in the description are described progressively, each embodiment mainly describes its difference between other embodiments, and the same or similar parts between respective embodiments may refer to each other.

The person skilled in the art should appreciate that embodiments of the disclosure may be implemented through a method, a terminal device or a computer program product. Therefore, embodiments of the disclosure may be realized through a full hardware embodiment, a full software embodiment or a combination of hardware and software embodiment. Furthermore, embodiments of the disclosure may be embodied in a computer program product operable in one or more computer available storage mediums (including but not limited to a disk memory, CD-ROM, an optical memory and the like) including computer available program codes.

Embodiments of the disclosure are described referring to a flowchart and/or block diagram of the method, the terminal device and the computer program product. It should be understood it may be embodied in the computer program product, i.e., each flow in the flowchart and/or each block in the block diagram, and a combination of the flow in the flowchart and/or the block in the block diagram. The computer program instructions may be provided to processor or processors of a general-purpose computer, a special-purpose computer, an embedded processor or other programmable data process terminal device to create a machine, so that the processor or processors of the above mentioned computers or other programmable data process terminal devices perform instructions so as to realize a terminal device having the specific function indicated by one or more flows in the flowchart and/or one or more blocks in the block diagram.

The computer program instructions may be stored in a computer readable storage medium which may guide the above mentioned computers or other programmable data process terminal devices to operate in a specific manner, so that the instructions stored in the computer readable storage medium create a product having an instruction device, and the instruction device may perform a specific function indicated by one or more flows in the flowchart and/or one or more blocks in the block diagram.

The instructions may also be loaded in the above mentioned computers or other programmable data process terminal devices, so that the above mentioned computers or other programmable data process terminal devices may perform a series of operation steps to generate processing implemented by a computer, and thus the instructions executable in the above mentioned computers or other programmable data process terminal devices may provide steps for realizing a specific function indicated by one or more flows in the flowchart and/or one or more blocks in the block diagram.

Although preferable embodiments have been described, other modification and changes to the embodiments may be made as long as the person skilled in the art knows the basic principle of inventiveness. Therefore, the attended claims is intended to be explained by the preferable embodiments, and all modification and changes fall into the scope of the embodiments of the disclosure.

Finally, it should be noted that the terms herein representing relationships such as first and second are only used to distinguish an entity or operation from another entity or operation, but do not necessarily require or imply these entities or operation having the actual relationship or order. Moreover, the term "comprise", "include" or any other variants thereof are intended to cover a non-exclusive inclusion, such that the process, method, product or terminal device including a number of elements not only includes these elements, but also other elements not explicitly listed, or other elements inherent in the process, method, product or terminal device. Unless otherwise restricted, the elements defined by the statement "comprise a . . . " does not exclude other elements which may be included in the process, method, product or terminal device including the elements.

The method and terminal device for controlling an antenna of the terminal device provided by the present disclosure are described in detail above, and the principle and embodiments of the present disclosure are explained by some specific examples. However, the above description of the embodiments is only used to help the understanding of the method and its core principle of the present disclosure. Meanwhile, one ordinarily skilled in the art may make any modification to the specific embodiments and their practical application scopes according to the principle of the present disclosure, and thus the contents described in the specification should be not construed as a limitation to the present disclosure.

What is claimed is:

1. A method for controlling an antenna of a terminal device, comprising:
    acquiring an environmental state parameter of the terminal device;
    calculating differences between the environmental state parameter and each of reference environment parameters of a preset antenna performance table, respectively;
    extracting an antenna performance parameter corresponding to the reference environment parameter when the differences meet a preset condition, wherein the preset condition includes a minimum difference or a minimum difference obtained based on weights assigned based on priority;
    adjusting an antenna signal of the terminal device using the antenna performance parameter.

2. The method according to claim 1, wherein the preset antenna performance parameter table is stored in a Non-Volatile Random Access Memory (NVRAM) of the terminal device.

3. The method according to claim 1, wherein a sensor is provided in the terminal device, and acquiring an environmental state parameter comprises:
    monitoring antenna signal strength of the terminal device; and
    acquiring the environmental state parameter monitored by the sensor when the antenna signal strength is less than a first preset threshold.

4. The method according to claim 1, wherein a sensor is provided in the terminal device, and acquiring an environmental state parameter further comprises:
    monitoring antenna signal strength of the terminal device; and
    acquiring the environmental state parameter monitored by the sensor when the antenna signal strength is greater than a second preset threshold.

5. The method according to claim 1, wherein the preset antenna performance parameter table comprises one or more preset reference environment parameter intervals, and extracting the antenna performance parameter comprises:
    searching for a reference environment parameter interval in which the environmental state parameter falls; and
    extracting the antenna performance parameter corresponding to the reference environment parameter interval.

6. The method according to claim 1, wherein the preset antenna performance parameter table comprises one or more preset reference environment parameters and corresponding reference antenna signal strength, and extracting the antenna performance parameter comprises:
    performing a fitting between the environmental state parameter and each of the preset reference environment parameter respectively or between a current antenna signal strength and each of the reference antenna signal strength;
    performing a corresponding adjustment on the antenna performance parameter corresponding to the reference environment parameters using a result of the fitting if a similarity of the fitting is greater than a third threshold; and
    acquiring the antenna performance parameter corresponding to the environmental state parameters.

7. The method according to claim 1, wherein the environmental state parameter comprises at least one environmental state parameter of humidity, air pressure, and temperature.

8. The method according to claim 1, wherein the antenna performance parameter comprises at least one antenna performance parameter of radiation power, radiation sensitivity, antenna gain and the pattern of an antenna.

9. A terminal device with an antenna, comprising:
a processor;
a memory for storing instruction executable by the processor, for perform a method comprising:
acquiring an environmental state parameter of the terminal device;
calculating differences between the environmental state parameter and each of reference environment parameters of a preset antenna performance table, respectively;
extracting an antenna performance parameter corresponding to the reference environment parameter when the differences meet a preset condition, wherein the preset condition includes a minimum difference or a minimum difference obtained based on weights assigned based on priority;
adjusting an antenna signal of the terminal device using the antenna performance parameter.

10. The terminal device according to claim 9, wherein the preset antenna performance parameter table is stored in a Non-Volatile Random Access Memory (NVRAM) of the terminal device.

11. The terminal device according to claim 9, wherein a sensor is provided in the terminal device a sensor, and acquiring an environmental state parameter comprises:
monitoring antenna signal strength of the terminal device; and
acquiring the environmental state parameter monitored by the sensor when the antenna signal strength is less or greater than a first preset threshold.

12. The terminal device according to claim 9, wherein a sensor is provided in the terminal device, and acquiring an environmental state parameter further comprises:
monitoring antenna signal strength of the terminal device; and
acquiring the environmental state parameter monitored by the sensor when the antenna signal strength is greater than a second preset threshold.

13. The terminal device according to claim 9, wherein the preset antenna performance parameter table comprises one or more preset reference environment parameter intervals, and extracting the antenna performance parameter comprises:
searching for a reference environment parameter interval in which the environmental state parameter falls in; and
extracting the antenna performance parameter corresponding to the reference environment parameter interval.

14. The terminal device according to claim 9, wherein the preset antenna performance parameter table comprises one or more preset reference environment parameters and corresponding reference antenna signal strength, and extracting an antenna performance parameter comprises:
performing a fitting between the environmental state parameter and each of the preset reference environment parameter respectively or between a current antenna signal strength and each of the reference antenna signal strength;
performing a corresponding adjustment on the antenna performance parameter corresponding to the reference environment parameters using a result of the fitting if a similarity of the fitting is greater than a third threshold; and
acquiring the antenna performance parameter corresponding to the environmental state parameters.

15. The terminal device according to claim 9, wherein the environmental state parameter comprises at least one environmental state parameter of humidity, air pressure, and temperature.

16. The terminal device according to claim 9, wherein the antenna performance parameter comprises at least one antenna performance parameter of radiation power, radiation sensitivity, antenna gain and the pattern of an antenna.

17. A non-transitory computer-readable storage medium having stored therein instructions that, when executed by a processor of a terminal device, causes the terminal device to perform method for controlling an antenna, the method comprising:
acquiring an environmental state parameter of the terminal device;
calculating differences between the environmental state parameter and each of reference environment parameters of a preset antenna performance table, respectively;
extracting an antenna performance parameter corresponding to the reference environment parameter when the differences meet a preset condition, wherein the preset condition includes a minimum difference or a minimum difference obtained based on weights assigned based on priority;
adjusting an antenna signal of the terminal device using the antenna performance parameter.

18. The storage medium according to claim 17, wherein a sensor is provided in the terminal device, and acquiring an environmental state parameter comprises:
monitoring antenna signal strength of the terminal device; and
acquiring the environmental state parameter monitored by the sensor when the antenna signal strength is less than a first preset threshold.

* * * * *